(12) United States Patent
Jung et al.

(10) Patent No.: US 11,410,709 B2
(45) Date of Patent: Aug. 9, 2022

(54) SEMICONDUCTOR DEVICE HAVING UPPER AND LOWER WIRING WITH DIFFERENT GRAIN SIZES

(71) Applicant: SAMSUNG ELECTRONICS CO., LTD., Suwon-si (KR)

(72) Inventors: Youjin Jung, Hwaseong-si (KR); Hongseon Ko, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 160 days.

(21) Appl. No.: 16/918,123

(22) Filed: Jul. 1, 2020

(65) Prior Publication Data

US 2021/0118472 A1 Apr. 22, 2021

(30) Foreign Application Priority Data

Oct. 21, 2019 (KR) .................. 10-2019-0130675

(51) Int. Cl.
| | |
|---|---|
| *G11C 5/02* | (2006.01) |
| *G11C 13/00* | (2006.01) |
| *H01L 27/24* | (2006.01) |
| *G11C 5/06* | (2006.01) |

(52) U.S. Cl.
CPC ............. *G11C 5/025* (2013.01); *G11C 5/06* (2013.01); *G11C 13/0007* (2013.01); *H01L 27/24* (2013.01)

(58) Field of Classification Search
CPC ....... G11C 5/025; G11C 5/06; G11C 13/0007; G11C 13/0004; G11C 2213/71; G11C 2213/76; H01L 27/24; H01L 27/2427; H01L 27/2436; H01L 27/2463; H01L 45/1233; H01L 45/143; H01L 45/144; H01L 45/06; H01L 45/122; H01L 21/76846; H01L 21/76895; H01L 21/76897; H01L 45/16
See application file for complete search history.

(56) References Cited

U.S. PATENT DOCUMENTS

| | | |
|---|---|---|
| 6,465,354 B1 | 10/2002 | Sugai et al. |
| 7,459,716 B2 | 12/2008 | Toda et al. |
| 8,530,880 B2 | 9/2013 | Strukov et al. |

(Continued)

FOREIGN PATENT DOCUMENTS

| | | |
|---|---|---|
| JP | 3293783 B2 | 4/2002 |
| JP | 2011-211116 A | 10/2011 |
| JP | 5531296 B2 | 6/2014 |

*Primary Examiner* — Jerome Leboeuf
(74) *Attorney, Agent, or Firm* — Lee IP Law, P.C.

(57) ABSTRACT

A semiconductor device including a semiconductor substrate; a memory cell structure on the semiconductor substrate; and a peripheral wiring structure between the semiconductor substrate and the memory cell structure to connect the semiconductor substrate and the memory cell structure, wherein the peripheral wiring structure includes at least one lower wiring structure and an upper wiring structure on the at least one lower wiring structure, the at least one lower wiring structure includes a lower wiring, the upper wiring structure includes an upper wiring, the lower wiring includes a first material layer having first grains, the upper wiring includes a second material layer having second grains, an average size of the second grains is smaller than an average size of the first grains.

20 Claims, 12 Drawing Sheets

(56) References Cited

U.S. PATENT DOCUMENTS

| | | |
|---|---|---|
| 2009/0302474 A1* | 12/2009 | Barmak ............ H01L 23/53238 |
| | | 257/E23.154 |
| 2011/0210303 A1 | 9/2011 | Muraoka et al. |
| 2014/0183738 A1* | 7/2014 | Jezewski ........... H01L 23/53295 |
| | | 438/653 |
| 2015/0070960 A1 | 3/2015 | Castro et al. |
| 2015/0349026 A1 | 12/2015 | Vadivelmurugan |
| 2016/0064667 A1 | 3/2016 | Noda |
| 2017/0011996 A1* | 1/2017 | Lee ..................... H01L 23/5226 |
| 2017/0271581 A1 | 9/2017 | Seong et al. |
| 2019/0148296 A1* | 5/2019 | Briggs ................ H01L 23/5226 |
| | | 257/758 |
| 2020/0411758 A1* | 12/2020 | Lin ..................... H01L 27/2436 |

* cited by examiner

SEMICONDUCTOR DEVICE HAVING UPPER AND LOWER WIRING WITH DIFFERENT GRAIN SIZES

CROSS-REFERENCE TO RELATED APPLICATION

Korean Patent Application No. 10-2019-0130675, filed on Oct. 21, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

In accordance with the trend for higher degrees of performance and lower levels of power in semiconductor devices such as memory devices, next-generation memory devices such as PRAM and RRAM are being developed. In order to increase the degree of integration of such memory devices, memory cells provided in three dimensions have been proposed, and reducing a planar area occupied by wiring structures and peripheral circuits capable of applying electrical signals to the three-dimensional memory cells have been considered.

SUMMARY

The embodiments may be realized by providing a semiconductor device including a semiconductor substrate; a memory cell structure on the semiconductor substrate; and a peripheral wiring structure between the semiconductor substrate and the memory cell structure to connect the semiconductor substrate and the memory cell structure, wherein the peripheral wiring structure includes at least one lower wiring structure and an upper wiring structure on the at least one lower wiring structure, the at least one lower wiring structure includes a lower wiring, the upper wiring structure includes an upper wiring, the lower wiring includes a first material layer having first grains, the upper wiring includes a second material layer having second grains, an average size of the second grains is smaller than an average size of the first grains.

The embodiments may be realized by providing a semiconductor device including a semiconductor substrate; a memory cell structure on the semiconductor substrate; and a peripheral wiring structure between the semiconductor substrate and the memory cell structure, wherein the peripheral wiring structure includes a lower wiring structure and an upper wiring structure on the lower wiring structure, the lower wiring structure includes a lower wiring including a first material layer having a first seam, the upper wiring structure includes an upper wiring including a second material layer having a second seam, and an average size of the second seam is smaller than an average size of the first seam.

The embodiments may be realized by providing a semiconductor device including a semiconductor substrate; a first conductive line on the semiconductor substrate and extending in a first direction, the first direction being parallel to an upper surface of the semiconductor substrate; a second conductive line on the first conductive line and extending in a second direction, intersecting the first direction, the second direction being parallel to an upper surface of the semiconductor substrate; a first memory cell structure between the first conductive line and the second conductive line; a first upper wiring and a second upper wiring between the semiconductor substrate and the first conductive line, the first upper wiring and the second upper wiring being located at a same level from the semiconductor substrate; a first contact structure on the first upper wiring and connecting the first conductive line to the first upper wiring; a second contact structure on the second upper wiring and connecting the second conductive line to the second upper wiring; at least one first lower wiring between the semiconductor substrate and the first upper wiring; at least one second lower wiring between the semiconductor substrate and the second upper wiring; a first upper contact via connecting the first upper wiring and the at least one first lower wiring; a second upper contact via connecting the second upper wiring and the at least one second lower wiring; a first lower contact via below the at least one first lower wiring; and a second lower contact via below the at least one second lower wiring, wherein the at least one first lower wiring and the at least one second lower wiring each include a first material layer having first grains, the first upper wiring and the second upper wiring each include a second material layer having second grains, and an average size of the second grains is smaller than an average size of the first grains.

BRIEF DESCRIPTION OF THE DRAWINGS

Features will be apparent to those of skill in the art by describing in detail exemplary embodiments with reference to the attached drawings in which.

DETAILED DESCRIPTION

Throughout the specification, terms such as "upper," "intermediate," and "lower" may be used to distinguish relative positions between components, and the technical spirit of the instant application may be defined by these terms. It may be not. Therefore, terms such as "upper," "intermediate," and "lower" may be replaced by other terms, such as "first," "second," and "third," and may be used to describe components of the specification. For example, the terms "upper wiring" and "intermediate wiring" used to distinguish relative positions may be replaced by and used interchangeably with the terms "first wiring" and "second wiring," or "upper wiring" and "lower wiring."

Figure 1:
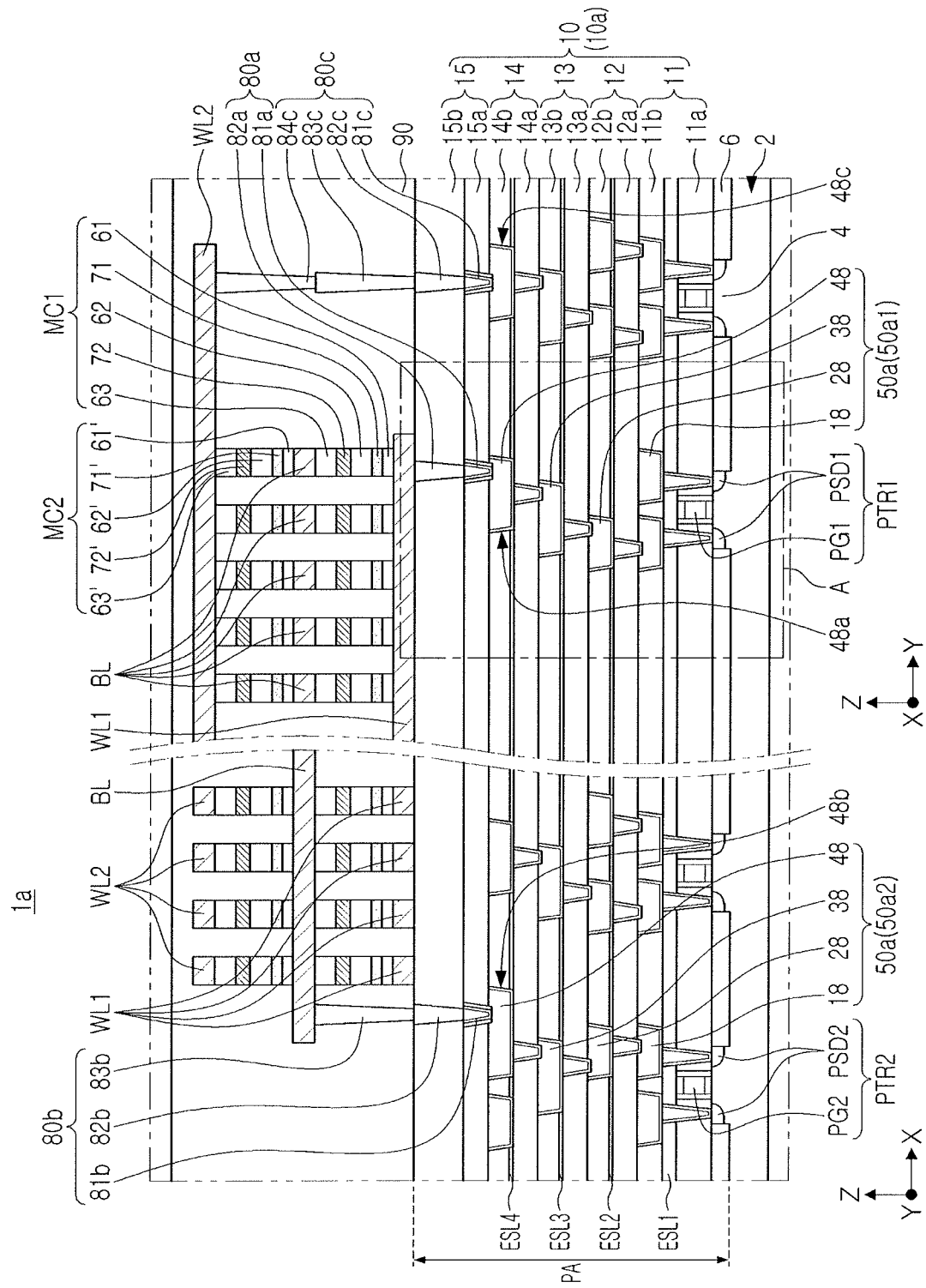
FIG. 1 illustrates a cross-sectional view of a semiconductor device according to an embodiment.
Figure 2:
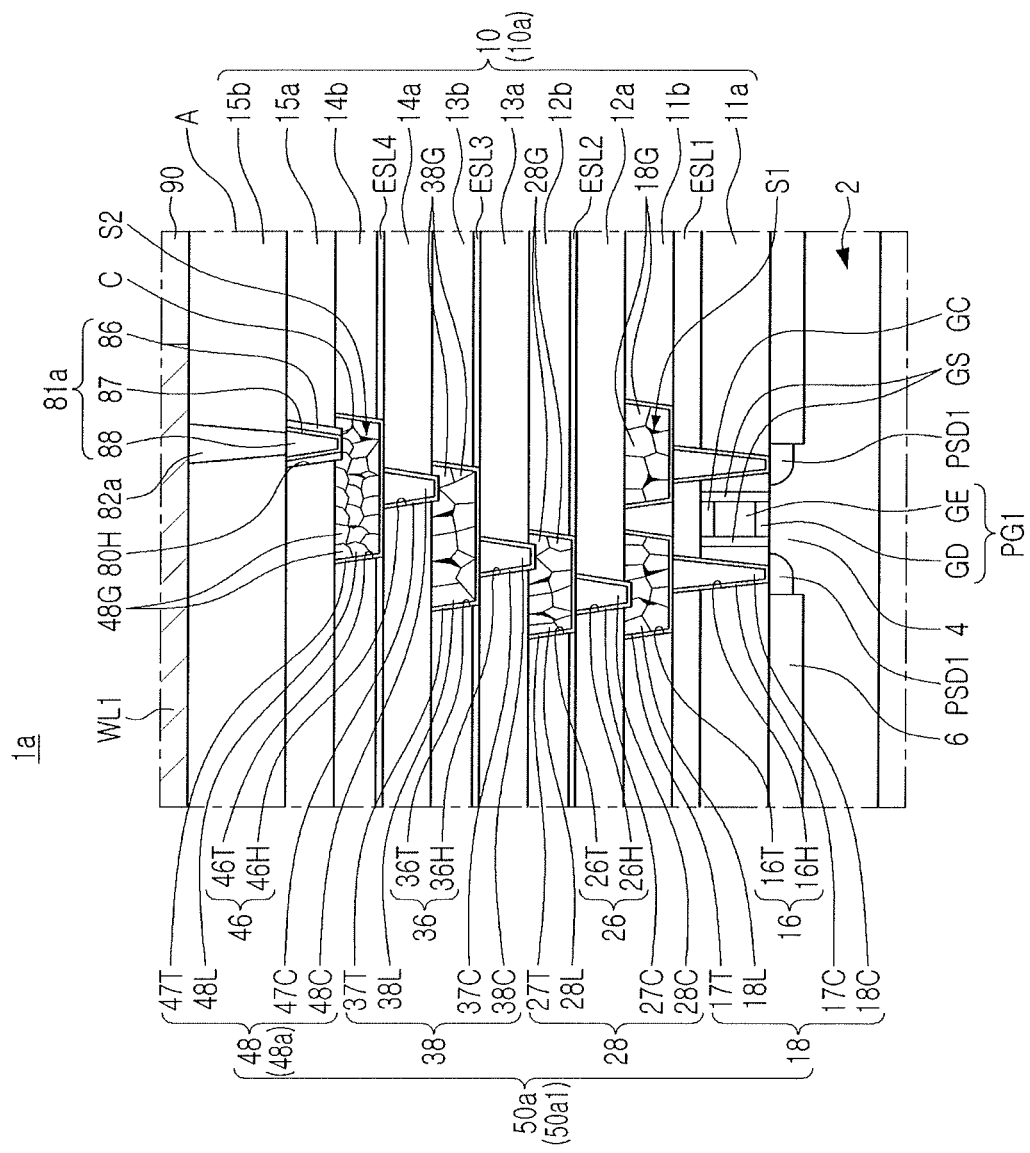
FIG. 2 illustrates an enlarged view of portion "A" of FIG. 1 in detail.

FIG. 1 is a cross-sectional view of a semiconductor device 1a according to an embodiment. FIG. 2 is an enlarged view of portion "A" of FIG. 1 in detail.

Referring to FIG. 1, a semiconductor device 1a according to an embodiment may include a semiconductor substrate 2, a circuit region PA on the semiconductor substrate 2, and first and second memory cell structures MC1 and MC2 on the circuit region PA. The semiconductor substrate 2 may be a semiconductor substrate formed of single crystal silicon.

The circuit region PA may further include an active region 4, and an element isolation region 6 defining the active region 4, on the semiconductor substrate 2. The element isolation region 6 may be a shallow trench element isolation region.

The circuit region PA may include first and second peripheral transistors PTR1 and PTR2. The first peripheral transistor PTR1 may include a first peripheral gate PG1 and a first source/drain region PSD1, and the second peripheral transistor PTR2 may include a second peripheral gate PG2 and a second source/drain region PSD2. For example, referring to FIG. 2, the first peripheral gate PG1 may include a gate dielectric GD on the active region 4, and a gate electrode GE on the gate dielectric GD.

A gate capping layer GC may cover an upper portion of the first peripheral gate PG1 and a gate spacer GS may be on side surfaces of each of the first peripheral gate PG1 and the gate capping layer GC.

The circuit region PA may further include first and second peripheral wiring structures 50a1 and 50a2, and a lower interlayer insulating film 10 on the semiconductor substrate 2 and surrounding the first and second peripheral wiring structures 50a1 and 50a2.

The lower interlayer insulating film 10 may be on the semiconductor substrate 2. The lower interlayer insulating film 10 may include a plurality of layers at different levels (e.g., at different distances from the substrate in a vertical or Z direction). In an implementation, the lower interlayer insulating film 10 may include a first lower interlayer insulating layer 11, a second lower interlayer insulating layer 12, a third lower interlayer insulating layer 13, a fourth lower interlayer insulating layer 14, and a fifth lower interlayer insulating layer 15, stacked in the Z direction, perpendicular to the (e.g., surface of) semiconductor substrate 2.

The first lower interlayer insulating layer 11 may include a first via interlayer insulating layer 11a and a first wiring interlayer insulating layer 11b, the second lower interlayer insulating layer 12 may include a second via interlayer insulating layer 12a and a second wiring interlayer insulating layer 12b, the third lower interlayer insulating layer 13 may include a third via interlayer insulating layer 13a and a third wiring interlayer insulating layer 13b, the fourth lower interlayer insulating layer 14 may include a fourth via interlayer insulating layer 14a and a fourth wiring interlayer insulating layer 14b, and the fifth lower interlayer insulating layer 15 may include a plurality of fifth plug interlayer insulating layers 15a and 15b.

A first lower capping layer ESL1 may be between the first via interlayer insulating layer 11a and the first wiring interlayer insulating layer 11b (e.g., in the Z direction). A second lower capping layer ESL2 may be between the second via interlayer insulating layer 12a and the first wiring interlayer insulating layer 12b. A third lower capping layer ESL3 may be between the third via interlayer insulating layer 13a and the third wiring interlayer insulating layer 13b. A fourth lower capping layer ESL4 may be between the fourth via interlayer insulating layer 14a and the fourth wiring interlayer insulating layer 14b. In an implementation, no lower capping layer may be present between the plurality of fifth plug interlayer insulating layers 15a and 15b.

The lower interlayer insulating film 10 may be formed of an oxide-based insulating film, e.g., a silicon oxide film or a low dielectric material film, and the first to fourth lower capping layers ESL1, ESL2, ESL3, and ESL4 may be formed of a nitride insulating layer, e.g., a silicon nitride layer.

The first and second peripheral wiring structures 50a1 and 50a2 may be on the semiconductor substrate 2 and in the lower interlayer insulating film 10.

The first peripheral wiring structure 50a1 may be electrically connected to the first peripheral transistor PTR1, and the second peripheral wiring structure 50a2 may be electrically connected to the second peripheral transistor PTR2. In an implementation, the first peripheral wiring structure 50a1 may be electrically connected to the first source/drain region PSD1 of the first peripheral transistor PTR1, and the second peripheral wiring structure 50a2 may be electrically connected to the second source/drain region PSD2 of the second peripheral transistor PTR2.

Each of the first and second peripheral wiring structures 50a1 and 50a2 may include at least one lower wiring structure 18, 28, and 38, and an upper wiring structure 48 on the at least one lower wiring structure 18, 28, and 38.

The first memory cell structures MC1 may each include a first lower electrode pattern 61 on a first conductive line WL1, a first lower pattern 71 on the first lower electrode pattern 61, an first intermediate electrode pattern 62 on the first lower pattern 71, a first upper pattern 72 on the first intermediate electrode pattern 62, and a first upper electrode pattern 63 on the first upper pattern 72.

The first lower electrode pattern 61 may be connected to the first conductive line WL1, and the first upper electrode pattern 63 may be connected to a second conductive line BL.

Each of the first lower electrode pattern 61, the first intermediate electrode pattern 62, and the first upper electrode pattern 63 may include at least one of a carbon layer, a metal layer, and a carbon-containing material layer. The carbon-containing material layer may be a material layer including carbon and metal. In an implementation, the carbon-containing material layer may include a carbon material and a metal material. In an implementation, the carbon-containing material layer may include a conductive material including a metal material such as W or Ti and carbon. The metal layer may be a tungsten layer.

In an implementation, the carbon-containing material layer may include a carbon material and a metal material as described above.

The first lower pattern 71 may be a switching material pattern, and the first upper pattern 72 may be an information storage material pattern.

Hereinafter, for convenience of description, the first lower pattern 71 may be referred to as a 'first switching material pattern,' and the first upper pattern 72 may be referred to as a 'first information storage material pattern.'

The first switching material pattern 71 may be formed of a material having characteristics of a switching element. In an implementation, the first switching material pattern 71 may be a threshold switching element. The first switching material pattern 71 may be an ovonic threshold switching element. The first switching material pattern 71 may be formed of a chalcogenide material, different from a chalcogenide material of the first information storage material pattern 72.

In an implementation, the first information storage material pattern 72 may be formed of a phase change memory material (e.g., alloys of Ge, Sb, Te, or the like), capable of changing from crystalline phase to amorphous phase, or from amorphous phase to crystalline phase during an operation of a semiconductor device, and the first switching material pattern 71 may be formed of a chalcogenide ovonic threshold switch material capable of maintaining an amorphous phase during the operation of the semiconductor device. In an implementation, the first switching material pattern 71 may include alloy materials including at least two elements of an As element, an S element, an Se element, a Te element, or a Ge element, or may include, in addition to the alloy material, additional elements (e.g., an Si element, an N element, or the like) in which an amorphous phase may be maintained at higher temperatures.

In an implementation, the first switching material pattern 71 may be formed of any one of alloy materials including Te, As, Ge, and Si, alloy materials including Ge, Te, and Pb, alloy materials including Ge, Se, and Te, alloy materials including Al, As, and Te, alloy materials including Se, As, Ge, and Si, alloy materials including Se, As, Ge and C, alloy materials including Se, Te, Ge, and Si, alloy materials including Ge, Sb, Te, and Se, an alloy material comprising Ge, Bi, Te, and Se, alloy materials including Ge, As, Sb, and Se, alloy materials including Ge, As, Bi, and Te, or alloy materials including Ge, As, Bi, and Se.

In an implementation, the first information storage material pattern 72 may be formed of phase change materials such as chalcogenide materials including Ge, Sb, and/or Te. In an implementation, the first information storage material pattern 72 may be a phase change material including at least one element of Te or Se, and at least one element of Ge, Sb, Bi, Pb, Sn, As, S, Si, P, 0, N, or In.

In an implementation, the first information storage material pattern 72 may be formed with an information storage material that may store information in another manner, instead of the phase change material.

Each of the second memory cell structures MC2 may include a second lower electrode pattern 61', a second switching material pattern 71', a second intermediate electrode pattern 62', a second upper pattern 72', and a second upper electrode pattern 63'.

The second memory cell structures MC2 may be formed of substantially the same structure and substantially the same material as the first memory cell structures MC1. In an implementation, the second lower electrode pattern 61', the second switching material pattern 71', the second intermediate electrode pattern 62', the second upper pattern 72', and the second upper electrode pattern 63' of the second memory cell structures MC2 may correspond to the first lower electrode pattern 61, the first switching material pattern 71, the first intermediate electrode pattern 62, the first information storage material pattern 72, and the first upper electrode pattern 63 of the first memory cell structures MC1.

The semiconductor device 1a according to an embodiment may further include first to third conductive lines WL1, BL, and WL2 electrically connected to the first and second memory cell structures MC1 and MC2, first to third contact structures 80a, 80b, and 80c connecting the first to third conductive lines WL1, BL, and WL2 to the first to third upper wiring structures 48a, 48b, and 48c, respectively, and an upper interlayer insulating film 90 surrounding at least a portion of the first and second memory cell structures MC1 and MC2, the first to third conductive lines WL1, BL, and WL2, and the first to third contact structures 80a, 80b, and 80c.

The upper interlayer insulating film 90 may be on the lower interlayer insulating film 10. The upper interlayer insulating film 90 may include an oxide insulating film, e.g., a silicon oxide film or a low dielectric material film. The first and second memory cell structures MC1 and MC2, the first to third conductive lines WL1, BL, and WL2, and the first to third contact structures 80a, 80b, and 80c may be in the upper interlayer insulating film 90.

The first and second memory cell structures MC1 and MC2 may be on the lower interlayer insulating film 10, and may be in the upper interlayer insulating film 90.

The first conductive lines WL1 (or lower word lines) may be on the lower interlayer insulating film 10, and may be below the first memory cell structures MC1 (e.g., may be between the semiconductor substrate 2 and the first memory cell structures MC1 in the Z direction). The first conductive lines WL1 may extend on the semiconductor substrate 2 in a first horizontal or Y direction, parallel to an upper surface of the semiconductor substrate 2. The first horizontal or Y direction may be parallel to the upper surface of the semiconductor substrate 2.

The second conductive lines BL (or hit lines) may be on the first memory cell structures MC1. The second conductive lines BL may extend on the first conductive lines WL1 in a second horizontal or X direction, intersecting (or perpendicular to) the first horizontal direction (Y direction). The second horizontal direction (X direction) may be parallel to the upper surface of the semiconductor substrate 2. The second conductive lines BL may overlap the first conductive lines WL1 in the vertical or Z direction.

The third conductive lines WL2 (or upper word lines) may be on the second memory cell structures MC2. The third conductive lines WL2 may extend on the second conductive lines BL in the Y direction, intersecting (or perpendicular to) the X direction.

The first contact structure 80a may include a first lower word line contact plug 81a, and a second lower word line contact plug 82a on the first lower word line contact plug 81a. The first contact structure 80a may connect the first conductive line WL1 and the first upper wiring structure 48a.

The second contact structure 80b may include a first bit line contact plug 81b, a second bit line contact plug 82b on the first bit line contact plug 81b, and a third bit line contact plug 83b on the second bit line contact plug 82b. The second contact structure 80b may connect the second conductive line BL and the second upper wiring structure 48b.

The third contact structure 80c may include a first upper word line contact plug 81c, a second upper word line contact plug 82c on the first upper word line contact plug 81c, a third upper word line contact plug 83c on the second upper word line contact plug 82c, and a fourth upper word line contact plug 84c on the third upper word line contact plug 83c. The third contact structure 80c may connect the third conductive line WL2 and a third upper wiring structure 48c.

The first lower word line contact plug 81a, the first bit line contact plug 81b, and the first upper word line contact plug 81c may be located at a same level (e.g., may be a same distance from the semiconductor substrate 2 in the Z direction). The second lower word line contact plug 82a, the second bit line contact plug 82b, and the second upper word line contact plug 82c may be located at a same level.

The plurality of contact plugs 81a, 82a, 81b, 82b, 83b, 81c, 82c, 83c, and 84c may be sequentially stacked in the Z direction on the semiconductor substrate 2. The plurality of contact plugs 81a, 82a, 81b, 82b, 83b, 81c, 82c, 83c, and 84c may pass through the upper interlayer insulating film 90, and the fifth lower interlayer insulating layer 15, a portion of the lower interlayer insulating film 10.

FIG. 2 is an example of the upper wiring structure 48 and the lower wiring structures 18, 28, and 38 in the semiconductor device 1a according to an embodiment in detail.

Referring to FIG. 2, the first peripheral wiring structure 50a1 according to an embodiment may include the first lower wiring structure 18, the second lower wiring structure 28, the third lower wiring structure 38, and the upper wiring structure 48. In an implementation, the first peripheral wiring structure 50a1 may be in the lower interlayer insulating film 10a.

The first lower wiring structure 18 may be a single damascene wiring structure filling a first lower opening 16 in first lower interlayer insulating layers 11a and 11b with a conductive material. The first lower opening 16 may include a first lower contact hole 16H exposing the first source/drain area PSD1, and a first lower wiring trench 16T on (e.g., and in communication with) the first lower contact hole 16H.

The first lower wiring structure 18 may include a first lower contact via 18C, a first lower wiring 18L, and first lower barrier layers 17T and 17C. The first lower wiring 18L may be on the first lower contact via 18C. The first lower contact via 18C may be in the first lower contact hole 16H, and the first lower wiring 18L may be in the first lower wiring trench 16T.

In an implementation, the first lower contact via 18C and the first lower wiring 18L may be formed of the same material. In an implementation, the first lower contact via 18C and the first lower wiring 18L may be formed of a refractory metal. In an implementation, the first lower contact via 18C and the first lower wiring 18L may be formed of tungsten, e.g., by using a CVD or PVD process.

The first lower barrier layers 17T and 17C may include a first lower contact via barrier layer 17C covering lower and side surfaces of the first lower contact via 18C, and a first lower wiring barrier layer 17T covering lower and side surfaces of the first lower wiring 18L and between the lower (e.g., semiconductor substrate 2-facing) surface of the first lower wiring 18L and an upper (e.g., first memory cell structure MC1-facing) surface of the first lower contact via 18C.

In an implementation, the first lower contact via 18C may pass through the first lower capping layer ESL1.

The second lower wiring structure 28 may be a single damascene wiring structure filling a second lower opening 26 in second lower interlayer insulating layers 12a and 12b with a conductive material. The second lower opening 26 may include a second lower contact hole 26H exposing the first lower wiring 18L, and a second lower wiring trench 26T on the second lower contact hole 26H.

The second lower wiring structure 28 may include a second lower contact via 28C, a second lower wiring 28L, and second lower barrier layers 27T and 27C. The second lower wiring 28L may be on the second lower contact via 28C. The second lower contact via 28C may be in the second lower contact hole 26H, and the second lower wiring 28L may be in the second lower wiring trench 26T.

In an implementation, the second lower contact via 28C and the second lower wiring 28L may be formed of the same material. In an implementation, the second lower contact via 28C and the second lower wiring 28L may be formed of a refractory metal. In an implementation, the second lower contact via 28C and the second lower wiring 28L may be formed of tungsten, e.g., by using a CVD or PVD process.

The second lower barrier layers 27T and 27C may include a second lower contact via barrier layer 27C covering lower and side surfaces of the second lower contact via 28C, and a second lower wiring barrier layer 27T covering lower and side surfaces of the second lower wiring 28L and between the lower surface of the second lower wiring 28L and an upper surface of the second lower contact via 28C.

In an implementation, the second lower contact via 28C may pass through the second lower capping layer ESL2.

The third lower wiring structure 38 may be a single damascene wiring structure filling a third lower opening 36 in third lower interlayer insulating layers 13a and 13b with a conductive material. The third lower opening 36 may include a third lower contact hole 36H exposing the second lower wiring 28L, and a third lower wiring trench 36T on the third lower contact hole 36H.

The third lower wiring structure 38 may include a third lower contact via 38C, a third lower wiring 38L, and third lower barrier layers 37T and 37C. The third lower wiring 38L may be on the third lower contact via 38C. The third lower contact via 38C may be in the third lower contact hole 36H, and the third lower wiring 38L may be in the third lower wiring trench 36T.

In an implementation, the third lower contact via 38C and the third lower wiring 38L may be formed of the same material. In an implementation, the third lower contact via 38C and the third lower wiring 38L may be formed of a refractory metal. In an implementation, the third lower contact via 38C and the third lower wiring 38L may be formed of tungsten, e.g., using a CVD or PVD process.

The third lower barrier layers 37T and 37C may include a third lower contact via barrier layer 37C covering lower and side surfaces of the third lower contact via 38C, and a third lower wiring barrier layer 37T covering lower and side surfaces of the third lower wiring 38L and between the lower surface of the third lower wiring 38L and an upper surface of the third lower contact via 38C.

In an implementation, the third lower contact via 38C may pass through the third lower capping layer ESL3.

At least a portion of the first to third lower wiring structures 18, 28, and 38 may be connected to each other by the lower contact vias 18C, 28C, and 38C, in a lower side (e.g., proximate to the semiconductor substrate 2 relative to the Z direction), respectively, and may be electrically connected to the first peripheral transistor PTR1 on the semiconductor substrate 2. The descriptions of the first to third lower wiring structures 18, 28, and 38 described above may be illustrative for representing a plurality of lower wirings located at different levels. In an implementation, the structure and the number of lower wiring structures between the semiconductor substrate 2 and the upper wiring structure 48 may be varied as desired.

The upper wiring structure 48 may be a single damascene wiring structure filling an upper opening 46 in fourth lower interlayer insulating layers 14a and 14b with a conductive material. The upper opening 46 may include an upper contact hole 46H exposing the third lower wiring 38L, and an upper wiring trench 46T on the upper contact hole 46H.

The upper wiring structure 48 may include an upper contact via 48C, an upper wiring 48L, and upper barrier layers 47T and 47C. The upper wiring 48L may be on the upper contact via 48C. The upper contact via 48C may be in the upper contact hole 46H, and the upper wiring 48L may be in the upper wiring trench 46T.

In an implementation, the upper contact via 48C and the upper wiring 48L may be formed of the same material. In an implementation, the upper contact via 48C and the upper wiring 48L may be formed of a refractory metal. In an implementation, the upper contact via 48C and the upper wiring 48L may be formed of, e.g., tungsten formed by using a CVD or PVD process. The upper wiring 48L may be electrically connected to at least one of the upper contact via 48C and the first to third lower wirings 18L, 28L, and 38L.

The upper barrier layers 47T and 47C may include an upper contact via barrier layer 47C covering lower and side surfaces of the upper contact via 48C, and an upper wiring barrier layer 47T covering lower and side surfaces of the upper wiring 48L and between the lower surface of the upper wiring 48L and an upper surface of the upper contact via 48C.

In an implementation, the upper contact via 48C may pass through the fourth lower capping layer ESL4.

In an implementation, the upper wiring structure 48 may be electrically connected to the first to third lower wiring structures 18, 28, and 38 through the upper contact via 48C. The upper contact via 48C may be in contact with the third lower wiring 38L, and may extend into the third lower wiring 38L. In an implementation, the lower surface of the upper contact via 48C may be located at a level lower than (e.g., closer to the semiconductor substrate 2 in the Z direction than) the upper surface of the third lower wiring 38L.

The first contact plug 81a may be on the upper wiring 48L to be electrically connected to the memory cell structures MC1 and MC2. The first contact plug 81a may include a first contact stud 88, a first stud barrier layer 87 surrounding side and lower surfaces of the first contact stud 88, and a first spacer layer 86 surrounding a side surface of the first stud barrier layer 87. A lower surface of the first contact plug 81a may be located at a level lower than an upper surface of the upper wiring 48L. In an implementation, at least a portion of the first spacer layer 86 may extend into the upper wiring 48L.

Referring to FIG. 1, together with FIG. 2, the first contact structure (80a of FIG. 1) connecting the memory cell structures MC1 and MC2 to the first peripheral wiring structure 50a1 may include at least one of the contact plugs 81a and 82a. The first contact plug 81a directly connected to the upper wiring 48L may have the spacer layer 86, having an insulating property, for adjusting a size of a contact plug hole 80H passing through the lower interlayer insulating layers 15a and 15b, or the upper interlayer insulating film 90. The spacer layer 86 may include an insulating oxide film, and at least a portion of the spacer layer 86 may contact the upper wiring 48L. During formation of the spacer layer 86, an oxide film constituting the spacer layer 86 may infiltrate through a seam, e.g., an empty space in a material (the refractory metal) layer constituting the upper wiring 48L, into the upper wiring 48L, and a relatively poor connection between the first contact plug 81a and the upper wiring 48L could occur.

In an implementation, in a semiconductor device according to an embodiment, a size of a grain of a material layer constituting the upper wiring 48L may be controlled, to provide a semiconductor device that minimizes infiltration of the spacer layer 86 into the upper wiring 48L and, as a result, helps improve productivity and reliability. In an implementation, sizes of the grains of the first material layer and the second material layer may be differently formed by adjusting a type of source gas and a temperature of a chamber during the CVD process.

For example, the first to third lower wirings 18L, 28L, and 38L may include a first material layer having first grains 18G, 28G, and 38G. The upper wiring 48L may include a second material layer having second grains 48G.

In an implementation, an average size (e.g., an average length of a major axis or greatest dimension) of the second grains 48G may be smaller than an average size of the first grains 18G, 28G, and 38G. The first material layer may include a first seam S1, the second material layer may include a second seam S2, and a size of the second seam S2 may be smaller than a size of the first seam S1. In an implementation, the grain size and seam size may be determined by measuring the maximum diameter of the grain or seam observed by TEM.

In an implementation, the first material layers included in each of the first to third lower wirings 18L, 28L, and 38L may be spaced apart from the first to third lower contact vias 18C, 28C, and 38C by the first to third lower wiring barrier layers 17T, 27T, and 37T, respectively.

In an implementation, the second material layer included in the upper wiring 48L may be spaced apart from the upper contact via 48C by the upper wiring barrier layer 47T.

In an implementation, a resistivity value of the second material layer may be 13 ohms or less, and a resistivity value of the first material layer may be 8 ohms or less.

In an implementation, the second peripheral wiring structure 50a2 illustrated in FIG. 1 may also include substantially the same or similar technical features as the aforementioned first peripheral wiring structure 50a1.

Figure 3:
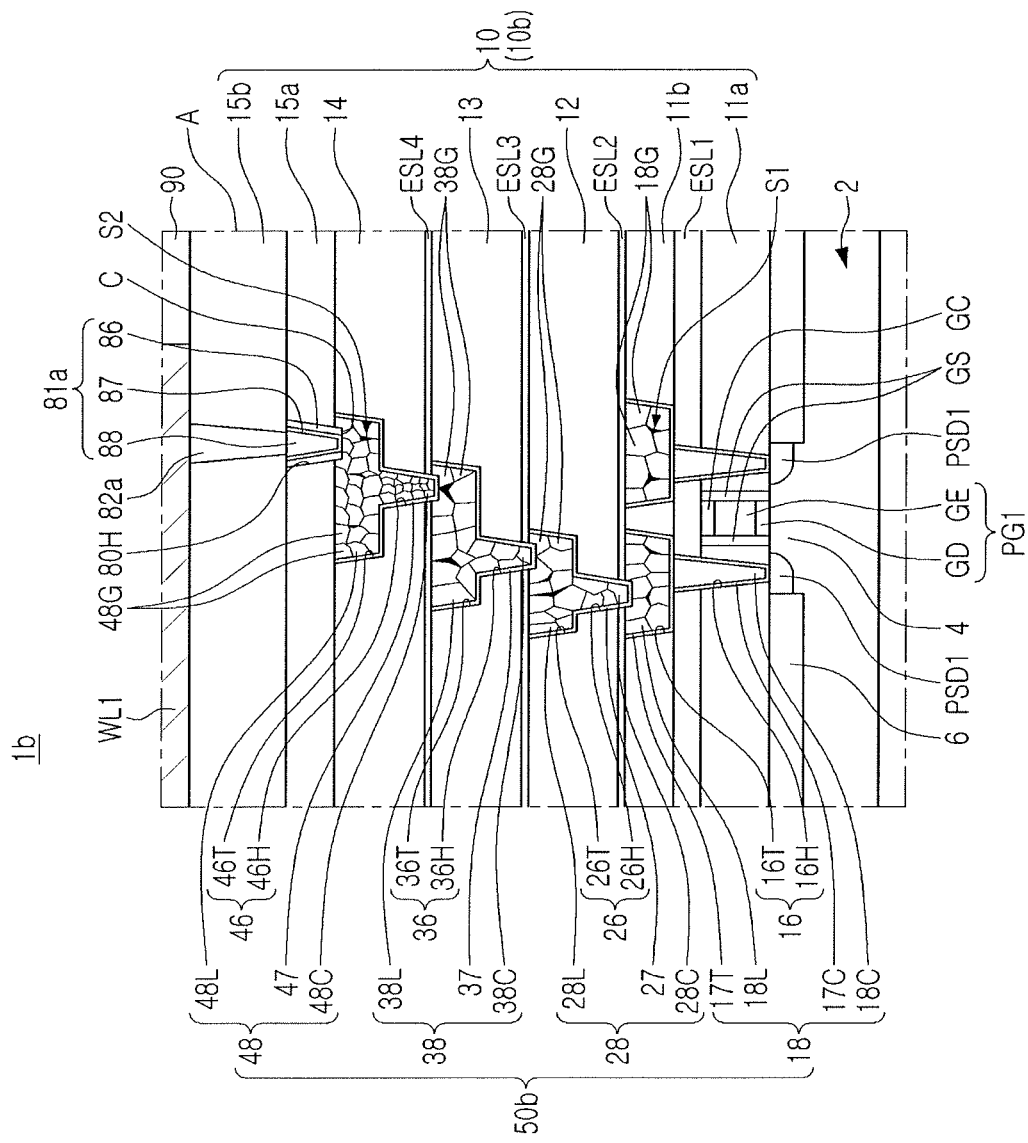
FIG. 3 illustrates an enlarged view of a portion of a semiconductor device according to an embodiment in detail.

FIG. 3 is an enlarged view of a portion of a semiconductor device 1b according to an embodiment in detail. FIG. 3 is a modified example of a component corresponding to portion "A" of FIG. 1. In FIG. 3, the same reference numerals as used in FIG. 2 may refer to the same elements. The semiconductor device 1b according to FIG. 3 may include components similar to the semiconductor device 1a described in FIG. 1, except for structures illustrated in FIG. 3.

Referring to FIG. 3, a peripheral wiring structure 50b according to an embodiment may include a first lower wiring structure 18, a second lower wiring structure 28, a third lower wiring structure 38, and a upper wiring structure 48. In an implementation, the peripheral wiring structure 50b may be in a lower interlayer insulating film 10b.

The lower wiring structures 18, 28, and 38 may be dual damascene wiring structures filling lower openings 16, 26, and 36 in lower interlayer insulating layers 11a, 11b, 12, and 13 with a conductive material. In an implementation, as illustrated in the drawing, the first lower wiring structure 18 located in a lowermost portion may be a single damascene structure, or may be formed of the same structure as the second and third lower wiring structures 28 and 38, in a different manner to those illustrated therein.

In an implementation, lower contact vias 18C, 28C, and 38C, and lower wirings 18L, 28L, and 38L, respectively corresponding thereto, may be integrally formed. The lower contact vias 18C, 28C, and 38C and the lower wirings 18L, 28L, and 38L may be formed of the same material. In an implementation, the first lower contact via 18C and the first lower wiring 18L may be formed of a refractory metal. In an implementation, the first lower contact via 18C and the first lower wiring 18L may be formed of tungsten, e.g., by using a CVD or PVD process.

In an implementation, first to third lower capping layers ESL1, ESL2, and ESL3 may be on the lower wirings 18L, 28L, and 38L, respectively. In an implementation, the first to third lower capping layers ESL1, ESL2, and ESL3 may be omitted, in a different manner to those illustrated therein.

The upper wiring structure 48 may be a damascene wiring structure filling an upper opening 46 in a fourth lower interlayer insulating layer 14 with a conductive material. An upper contact via 48C and an upper wiring 48L may be integrally formed. The upper contact via 48C and the upper wiring 48L may be formed of the same material. In an implementation, the upper contact via 48C and the upper wiring 48L may be formed of a refractory metal. In an implementation, the upper contact via 48C and the upper wiring 48L may be formed of tungsten, e.g., using a CVD or PVD process.

For example, at least one of the lower wiring structures 28 and 38 below the upper wiring structure 48 may include a lower wiring 28L or 38L, a lower contact via 28C or 38C extending in a direction from a lower portion of the lower wiring 28L or 38L toward the semiconductor substrate 2 (e.g., in the Z direction), and a lower barrier layer 27 or 37 covering lower and side surfaces of the lower wiring 28L or 38L and extending to side and lower surfaces of the lower contact via 28C or 38C, and the upper wiring structure 48 may include an upper wiring 48L, an upper contact via 48C extending in a direction from a lower portion of the upper wiring 48L toward the semiconductor substrate 2, and an upper barrier layer 47 covering lower and side surfaces of the upper wiring 48L and extending to side and lower surfaces of the upper contact via 48C. In an implementation, a second material layer constituting the upper wiring 48L may extend into the upper contact via 48C.

Other components may have technical features substantially the same as or similar to those described with reference to FIGS. 1 and 2, and repeated detailed descriptions thereof may be omitted.

Figure 4:
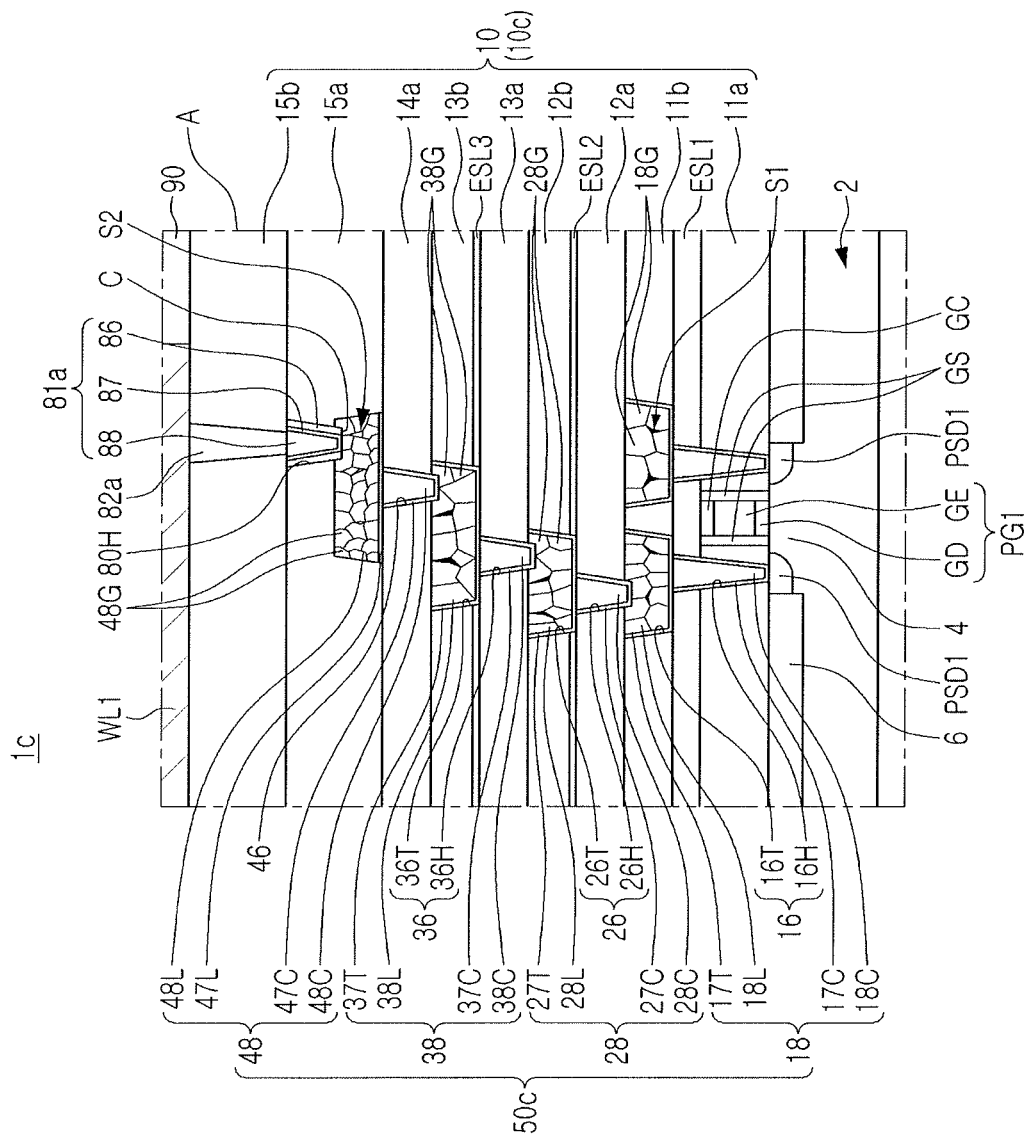
FIG. 4 illustrates an enlarged view of a portion of a semiconductor device according to an embodiment concept in detail.

FIG. 4 is an enlarged view of a portion of a semiconductor device 1c according to an embodiment. FIG. 4 is a modified example of a component corresponding to portion "A" of FIG. 1. In FIG. 4, the same reference numerals as used in FIG. 2 may refer to the same elements. The semiconductor device 1 c according to FIG. 4 may include components similar to the semiconductor device 1a described in FIG. 1, except for structures illustrated in FIG. 4.

Referring to FIG. 4, in a first peripheral wiring structure 50c according to an embodiment, an upper contact via 48C may pass through a fourth via interlayer insulating layer 14a. An upper contact via barrier layer 47C may cover lower and side surfaces of the upper contact via 48C. A lower surface of the upper contact via barrier layer 47C may be located at a level lower than an upper surface of a lower wiring 38L below the upper contact via barrier layer 47C. In an implementation, the upper contact via 48C may extend into the lower wiring 38L. In an implementation, the upper contact via 48C may be formed of tungsten, e.g., formed using a CVD or PVD process. In an implementation, the upper contact via barrier layer 47C may be formed of a conductive nitride (e.g., TiN).

An upper wiring 48L may be on the fourth via interlayer insulating layer 14a, and may overlap the upper contact via 48C. A upper wiring barrier layer 47L may be below a bottom surface of the upper wiring 48L (e.g., between the upper wiring 48L and the fourth via interlayer insulating layer 14a and between the upper wiring 48L and the upper contact via 48C). In an implementation, the upper wiring barrier layer 47L may not cover a side surface of the upper wiring 48L (e.g., may not be between the upper wiring 48L and the fifth via interlayer insulating layer 15a). The upper wiring barrier layer 47L may be below the bottom surface of the upper wiring 48L, and may not extend onto the side surface of the upper wiring 48L.

In an implementation, the upper wiring barrier layer 47L may be formed of a conductive nitride such as TiN. In an implementation, the upper wiring 48L may be formed of tungsten, e.g., by using a CVD or PVD process.

The upper contact via 48C and the upper wiring 48L may be spaced apart from each other, and the upper wiring barrier layer 47L may be between the upper contact via 48C and the upper wiring 48L.

In an implementation, the lower wiring structures 18, 28, and 38 may include lower wiring barrier layers 17T, 27T, and 37T covering lower and side surfaces of lower wirings 18L, 28L, and 38L, respectively, and an upper wiring structure 48 may include the upper wiring barrier layer 47L covering a lower surface of the upper wiring 48L, and the upper wiring barrier layer 47L may not cover the side surface of the upper wiring 48L. In an implementation, the side surface of the lower wiring 18L, 28L, or 38L may be tapered such that a width (e.g., in the horizontal X or Y direction) of the lower wiring 18L, 28L, or 38L increases along the vertical Z direction. In an implementation, the side surface of the upper wiring 48L may be tapered such that a width (e.g., in the horizontal X or Y direction) of the upper wiring 48L decreases along the vertical Z direction.

Other components have technical features substantially the same as or similar to those described with reference to FIGS. 1 and 2, and thus, detailed descriptions thereof will be omitted.

FIGS. 5 to 8 are cross-sectional views of stages in a method of manufacturing a semiconductor device including the components of FIG. 2.

Figure 5:
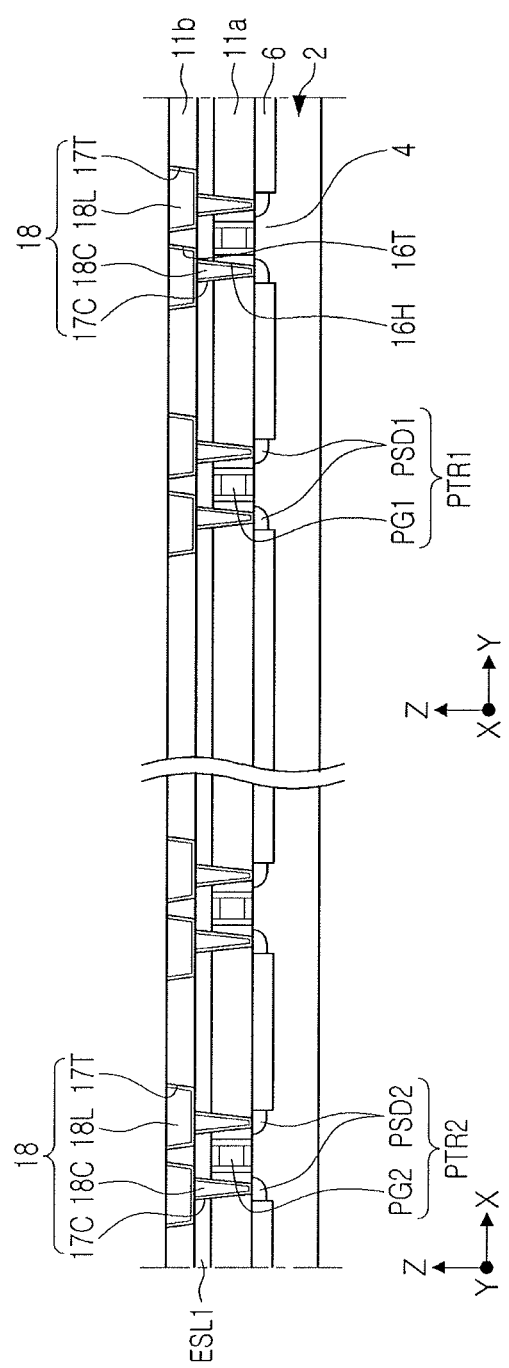
FIGS. 5 to 8 illustrate cross-sectional views of stages in a method of manufacturing a semiconductor device including the components of FIG. 2.

Referring to FIG. 5, an element isolation region 6 may be formed on a semiconductor substrate 2 to define an active region 4. The semiconductor substrate 2 may be a single crystal silicon substrate. Individual elements constituting circuits may be formed on the semiconductor substrate 2. The circuits may include, e.g., an X decoder (XDEC), a peripheral circuit (PERI), a page buffer (PGBUF), and the like.

The individual elements constituting the circuits may include first and second peripheral transistors PTR1 and PTR2. The first peripheral transistor PTR1 may include a first peripheral gate PG1 and a first source/drain region PSD1, and the second peripheral transistor PTR2 may include a second peripheral gate PG2 and a second source/drain region PSD2.

In an implementation, the first peripheral transistor PTR1 may be a transistor constituting the peripheral circuit (PERI), and the second peripheral transistor PTR2 may be a transistor constituting the X decoder (XDEC).

A first via interlayer insulating layer 11a and a first lower capping layer ESL1 may be formed to be sequentially stacked on the semiconductor substrate 2 (having the first and second peripheral transistors PTR1 and PTR2 thereon). The first via interlayer insulating layer 11a may be formed of a silicon oxide insulating material.

A first lower contact hole 16H (passing through the first via interlayer insulating layer 11a and the first lower capping layer ESL1) may be formed by using a single damascene process. Subsequently, a first contact via barrier layer 17C may be formed on bottom and sidewall surfaces of the first lower contact hole 16H, and a first lower contact via 18C may be formed in the first contact via barrier layer 17C.

A first wiring interlayer insulating layer 11b may be formed on the first lower capping layer ESL1 and the first lower contact via 18C, and a first lower wiring trench 16T on the first lower contact via 18C and passing through the first wiring interlayer insulating layer 11b may be formed. A first lower wiring barrier layer 17T and a first lower wiring 18L may be formed in the first lower wiring trench 16T.

An upper surface of the first wiring interlayer insulating layer 11b and an upper surface of the first lower wiring 18L may be on a same level or surface (e.g., may be coplanar) by a planarization process. The planarization process may be a chemical mechanical polishing process.

Figure 6:
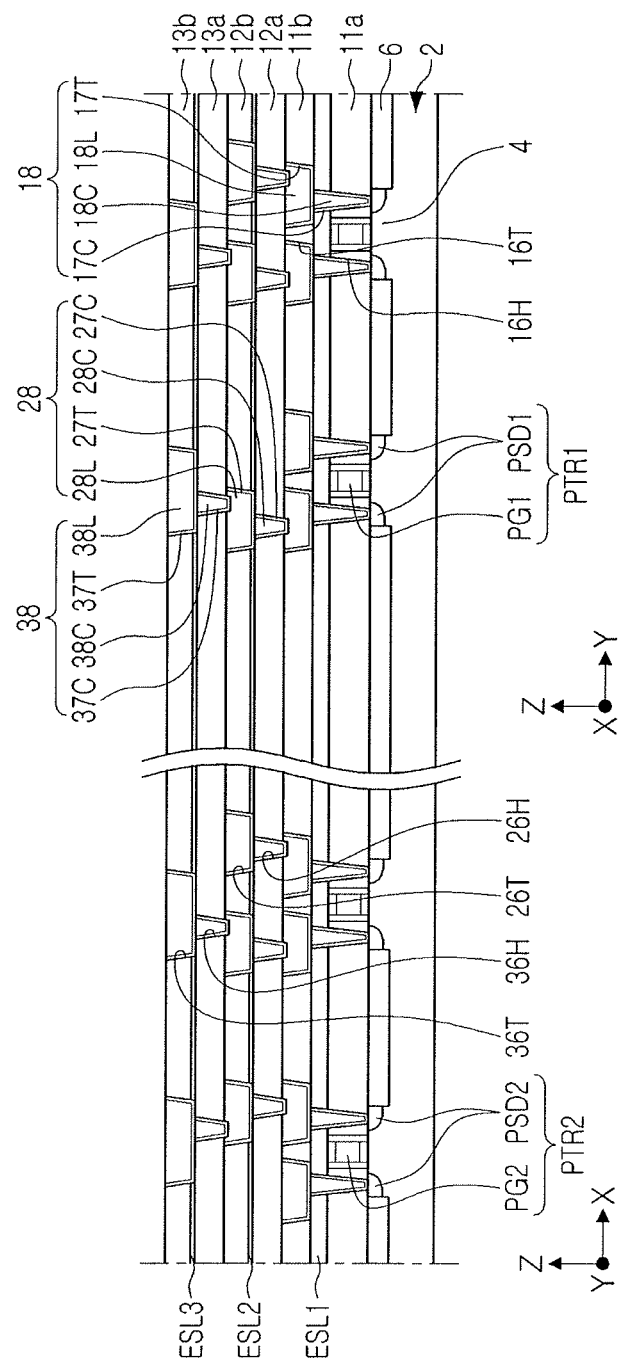

Referring to FIG. 6, a second via interlayer insulating layer 12a may be formed on the first wiring interlayer insulating layer 11b. A second lower contact hole 26H passing through the second via interlayer insulating layer 12a may be formed by a damascene process.

A second contact via barrier layer 27C and a second lower contact via 28C may be sequentially formed in the second lower contact hole 26H.

A second lower capping layer ESL2 and a second wiring interlayer insulating layer 12b may be sequentially formed on the second via interlayer insulating layer 12a and the second lower contact via 28C.

A second lower wiring trench 26T (on the second lower contact via 28C and passing through the second interlayer insulating layer 12b and the second lower capping layer ESL2) may be formed. A second lower wiring barrier layer 27T and a second lower wiring 28L may be sequentially formed in the second lower wiring trench 26T.

A third via interlayer insulating layer 13a may be formed on the second wiring interlayer insulating layer 12b. A third lower contact hole 36H (passing through the third via interlayer insulating layer 13a) may be formed using a damascene process.

A third contact via barrier layer 37C and a third lower contact via 38C may be sequentially formed in the third lower contact hole 36H.

A third lower capping layer ESL3 and a third wiring interlayer insulating layer 13b may be sequentially formed on the third via interlayer insulating layer 13a and the third lower contact via 38C.

A third lower wiring trench 36T (on the third lower contact via 38C and passing through the third wiring interlayer insulating layer 13b and the third lower capping layer ESL3) may be formed. A third lower wiring barrier layer 37T and a third lower wiring 38L may be sequentially formed in the third lower wiring trench 36T.

Figure 7:
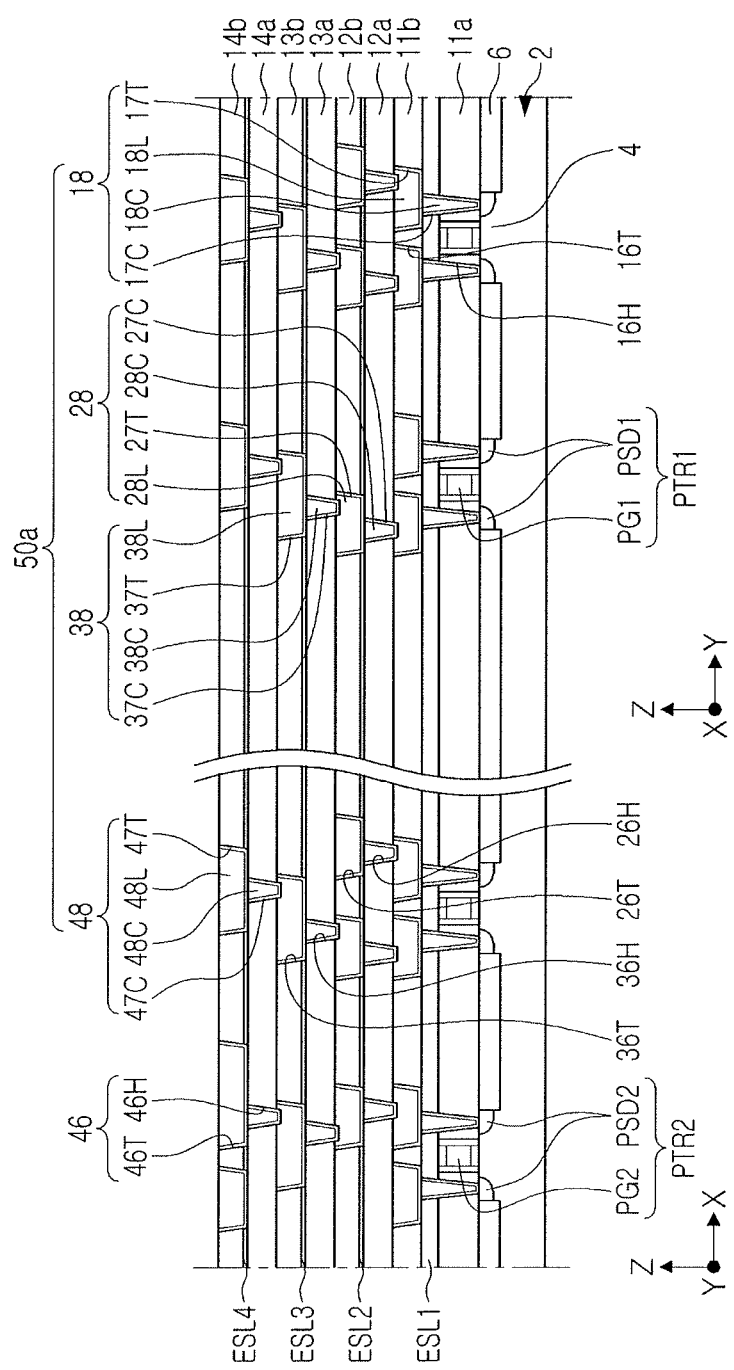

Referring to FIG. 7, a fourth via interlayer insulating layer 14a may be formed on the third wiring interlayer insulating layer 13b. An upper contact hole 46H passing through the fourth via interlayer insulating layer 14a may be formed using a damascene process.

An upper contact via barrier layer 47C and an upper contact via 48C may be sequentially formed in the upper contact hole 4614.

A fourth lower capping layer ESL4 and a fourth wiring interlayer insulating layer 14b may be sequentially formed on the fourth via interlayer insulating layer 14a and the upper contact via 48C.

An upper wiring trench 46T (on the upper contact via 48C and passing through the fourth wiring interlayer insulating layer 14b and the fourth lower capping layer ESL4) may be formed. An upper wiring barrier layer 47T and an upper wiring 48L may be sequentially formed in the upper wiring trench 46T.

As described in the description of FIG. 2, formation conditions of a second material layer included in the upper wiring 48L may be controlled such that a size of a grain of the second material layer is smaller than a size of a grain of a first material layer included in the lower wirings 18L, 28L, and 38L. In an implementation, sizes of the grains of the first material layer and the second material layer may be differently formed by adjusting a type of source gas and a temperature of a chamber during the CVD process. An upper surface of the fourth wiring interlayer insulating layer 14b and an upper surface of the upper wiring 48L may be on a same level or surface (e.g., may be coplanar) by the planarization process. A size of a second seam included in the second material layer may be smaller than a size of a first seam included in the first material layer (e.g., due to closer packing of smaller grains of the second material layer).

Figure 8:
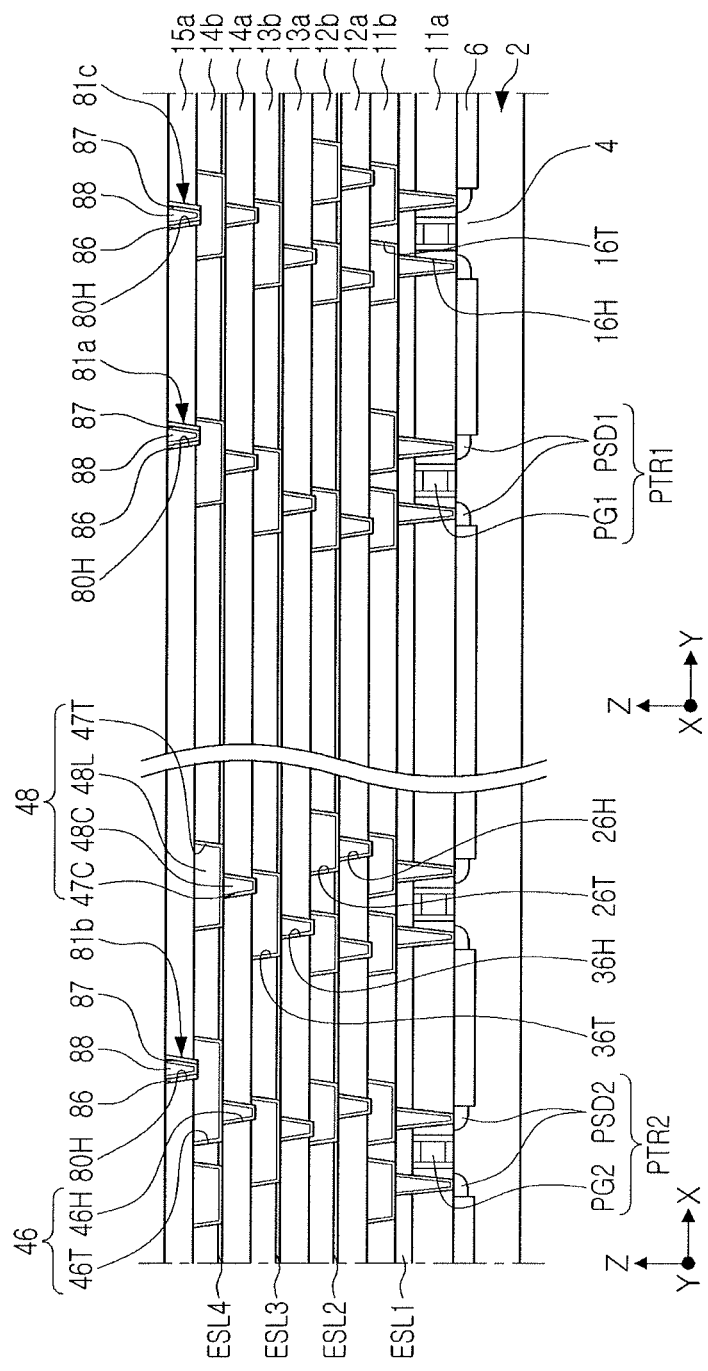

Referring to FIG. 8, a fifth interlayer insulating layer 15a may be formed on the fourth wiring interlayer insulating layer 14b and the upper wiring 48L.

A contact plug hole 80H may be formed through the fifth interlayer insulating layer 15a to expose a portion of the upper wiring 48L.

A spacer layer 86 may be formed on a sidewall of the contact plug hole 80H. Forming the spacer layer 86 may include forming an insulating material layer covering sidewalls and bottom surfaces of the contact plug hole 80H, and anisotropically etching the insulating material layer. The spacer layer 86 may be formed of silicon oxide.

A stud barrier layer 87 may be formed on a bottom surface and the sidewall of the contact plug hole 80H having the spacer layer 86 formed therein, and a contact stud 88 filling the contact plug hole 80H may be formed.

In an implementation, the contact plug hole 80H may extend into the upper wiring 48L. For example, the contact plug hole 80H may be formed by removing at least a portion of an upper region of the upper wiring 48L. Reliability for connection of the contact stud 88 and the upper wiring 48L may be improved and, as described above, the grain size of the second material layer constituting the upper wiring 48L may be reduced, such that infiltration of the spacer layer 86 into the upper wiring 48L may be minimized.

Referring back to FIG. 1, the upper interlayer insulating film 90 on the fifth interlayer insulating layer 15a, the first and second memory cell structures MC1 and MC2 in the upper interlayer insulating film 90, the first to third conductive lines WL1, BL, and WL2, and the first to third contact structures 80a, 80b, and 80c may be formed. The first and second memory cell structures MC1 and MC2 and the first to third contact structures 80a, 80b, and 80c may be formed to pass through the upper interlayer insulating film 90. In an implementation, a suitable manufacturing method of the components formed in the upper interlayer insulating film 90 may be used.

Figure 9:
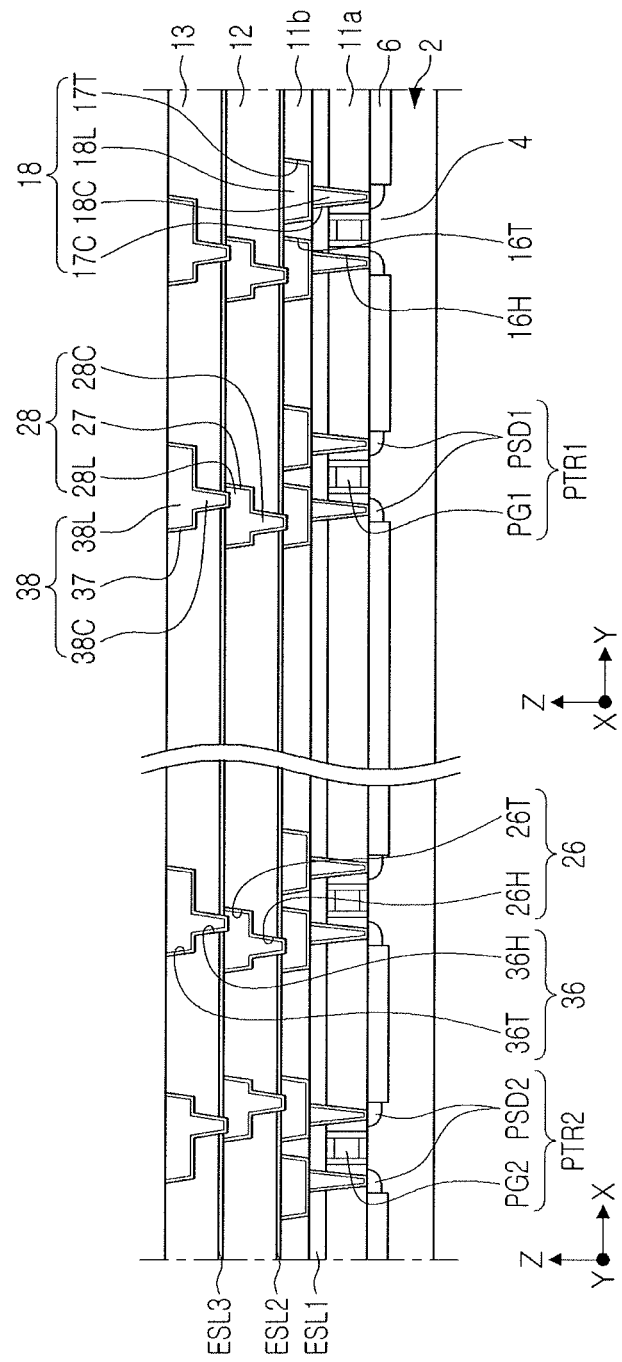
FIGS. 9 and 10 illustrate cross-sectional views of stages in a method of manufacturing a semiconductor device including the components of FIG. 3.
Figure 10:
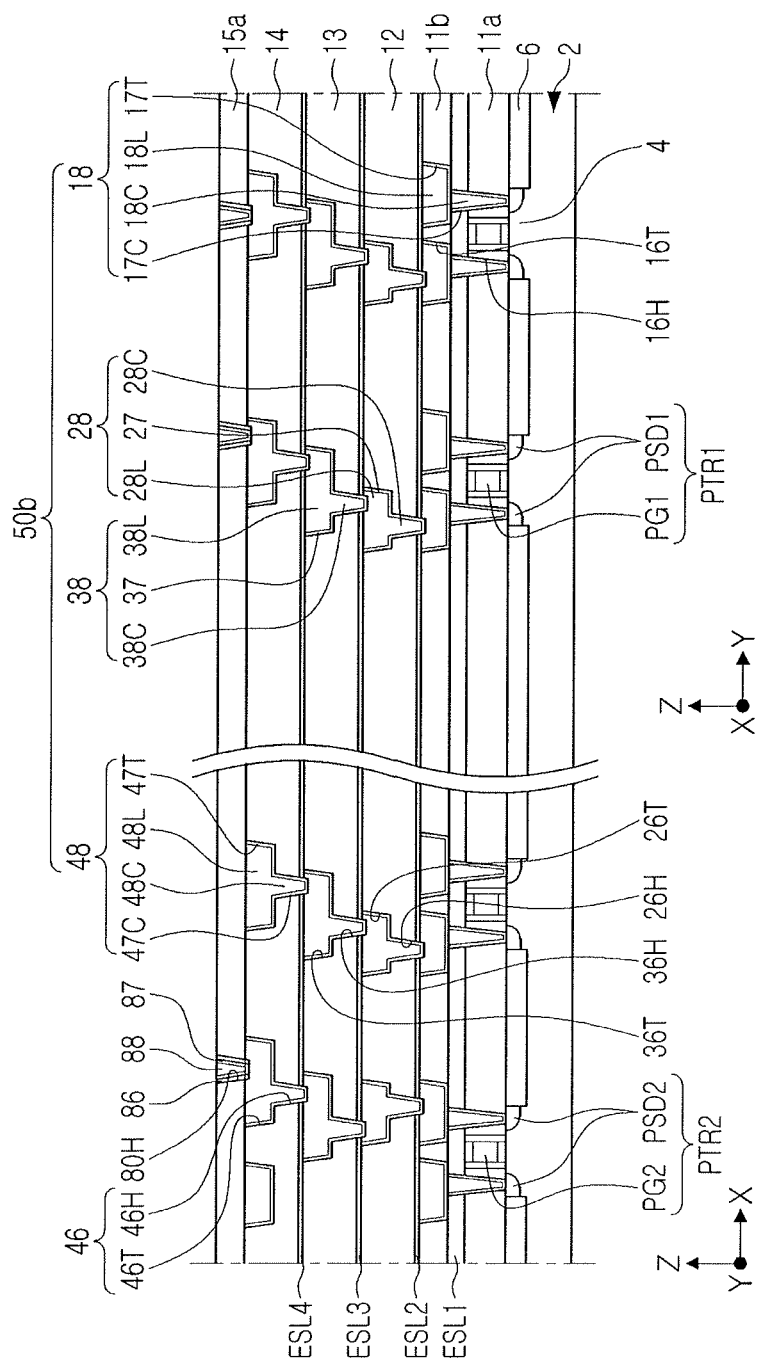

FIGS. 9 and 10 are cross-sectional views of stages in a method of manufacturing a semiconductor device including the components of FIG. 3.

Referring to FIG. 9, a first lower wiring structure 18 may be formed by a method similar to that of FIG. 5. A first lower capping layer ESL1 and a second interlayer insulating layer 12 may be formed on a first wiring interlayer insulating layer 11b.

A second lower opening 26 including a second lower contact hole 26H passing through the second interlayer insulating layer 12 and the first lower capping layer ESL1 and exposing the first lower wiring structure 18, and a second lower wiring trench 26T disposed on the second lower contact hole 26H may be formed using a dual damascene process A barrier layer and a wiring material layer may be sequentially deposited on the structure having the second lower opening 26, and the wiring material layer and the barrier layer may be planarized until an upper surface of a second lower interlayer insulating film ESL2 is exposed. A second lower wiring structure 28 may be formed by planarization. The second lower wiring structure 28 may include a second lower contact via 28C, a second lower wiring 28L integrally formed with the second lower contact via 28C, and a second lower barrier layer 27 covering bottom and side surfaces of the second lower contact via 28C and covering bottom and side surfaces of the second lower wiring 28L.

A third lower capping layer ESL3 may be formed to cover the second lower wiring structure 28 and the second lower interlayer insulating layer 12. The first to third lower capping layers ESL1, ESL2, and ESL3 may be formed of silicon nitride.

A third lower interlayer insulating layer 13 may be formed on the third lower capping layer ESL3. A third lower opening 36 including a third lower contact hole 36H passing through the third lower interlayer insulating layer 13 and the third lower capping layer ESL3 and exposing the second lower wiring structure 28, and a third lower wiring trench 36T on the third lower contact hole 36H may be formed using a dual damascene process.

A barrier layer and a wiring material layer may be sequentially deposited on the structure having the third lower opening 36, and the wiring material layer and the barrier layer may be planarized until an upper surface of the third lower interlayer insulating layer 13 is exposed. A third lower wiring structure 38 may be formed by planarization. The third lower wiring structure 38 may include a third lower contact via 38C, a third lower wiring 38L integrally formed with the third lower contact via 38C, and a third lower barrier layer 37 covering bottom and side surfaces of the third lower contact via 38C and covering bottom and side surfaces of the third lower wiring 38L.

Referring to FIG. 10, a fourth lower capping layer ESL4 may be formed on the third lower wiring structure 38 and the third lower interlayer insulating layer 13. The fourth lower capping layer ESL4 may be formed of silicon nitride.

A fourth lower interlayer insulating layer 14 may be formed on the fourth lower capping layer ESL4.

An upper opening 46 including an upper contact hole 46FI passing through the fourth lower interlayer insulating layer 14 and an upper wiring trench 46T disposed on the upper contact hole 46H may be formed using a damascene process.

An upper wiring barrier layer 47T and an upper wiring 48L may be sequentially formed in the upper wiring trench 46T. As described above, a material layer constituting the upper wiring 48L may be formed to have a size of a grain smaller than sizes of grains of the material layers constituting the first to third lower wirings 18L, 28L, and 38L.

A fifth interlayer insulating layer 15a may be formed on the fourth lower interlayer insulating layer 14 and the upper wiring 48L.

A contact plug hole 80H may be formed through the fifth interlayer insulating layer 15a to expose a portion of the upper wiring 48L.

A spacer layer 86 may be formed on a sidewall of the contact plug hole 80H. Forming the spacer layer 86 may include forming an insulating material layer covering sidewalls and bottom surfaces of the contact plug hole 80H, and anisotropically etching the insulating material layer. The spacer layer 86 may be formed of silicon oxide.

A stud barrier layer 87 may be formed on a bottom surface and the sidewall of the contact plug hole 80H having the spacer layer 86 formed therein, and a contact stud 88 filling the contact plug hole 80F1 may be formed.

In an implementation, the contact plug hole 80H may extend into the upper wiring 48L. In an implementation, the contact plug hole 80H may be formed by removing at least a portion of an upper region of the upper wiring 48L. Reliability for connection of the contact stud 88 and the upper wiring 48L may be improved, and as described above, the grain size of the second material layer constituting the upper wiring 48L may be reduced, such that infiltration of the spacer layer 86 into the upper wiring 48L may be minimized. Thereafter, components such as a memory cell structure may be formed by the manufacturing method described with reference to FIG. 1.

Figure 11:
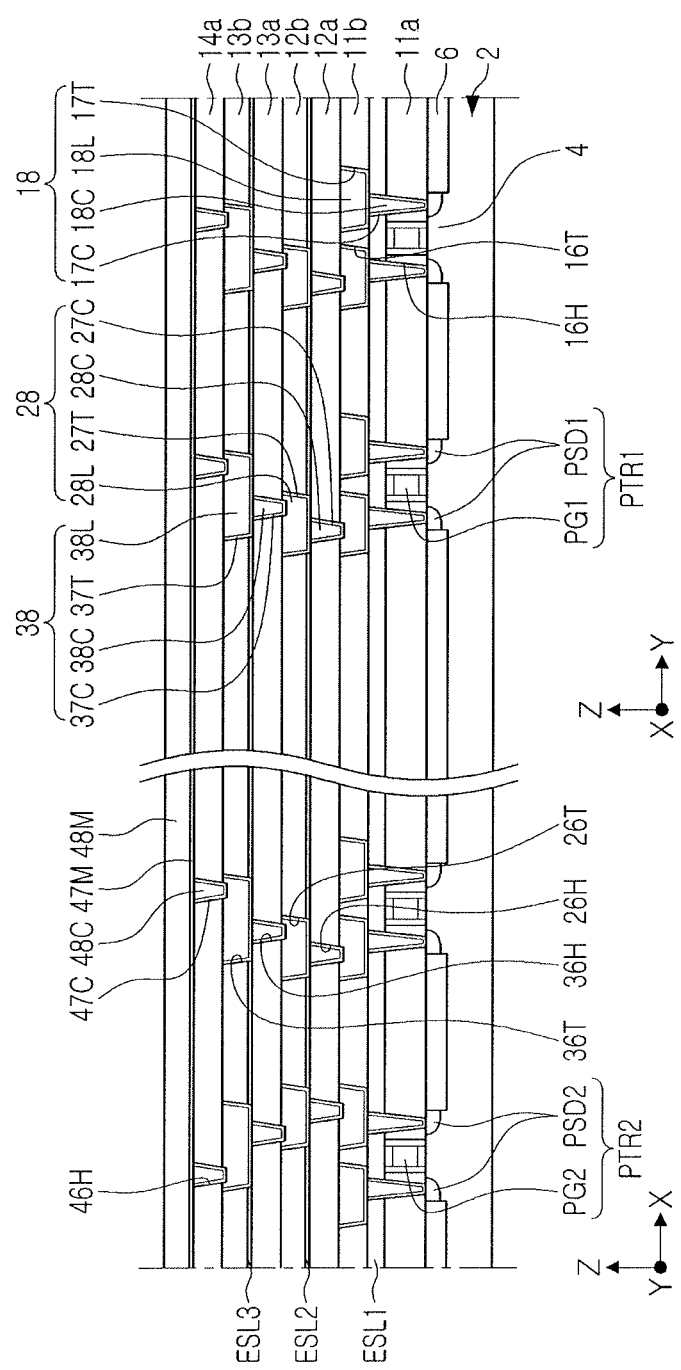
FIGS. 11 and 12 illustrate cross-sectional views of stages in a method of manufacturing a semiconductor device including the components of FIG. 4.
Figure 12:
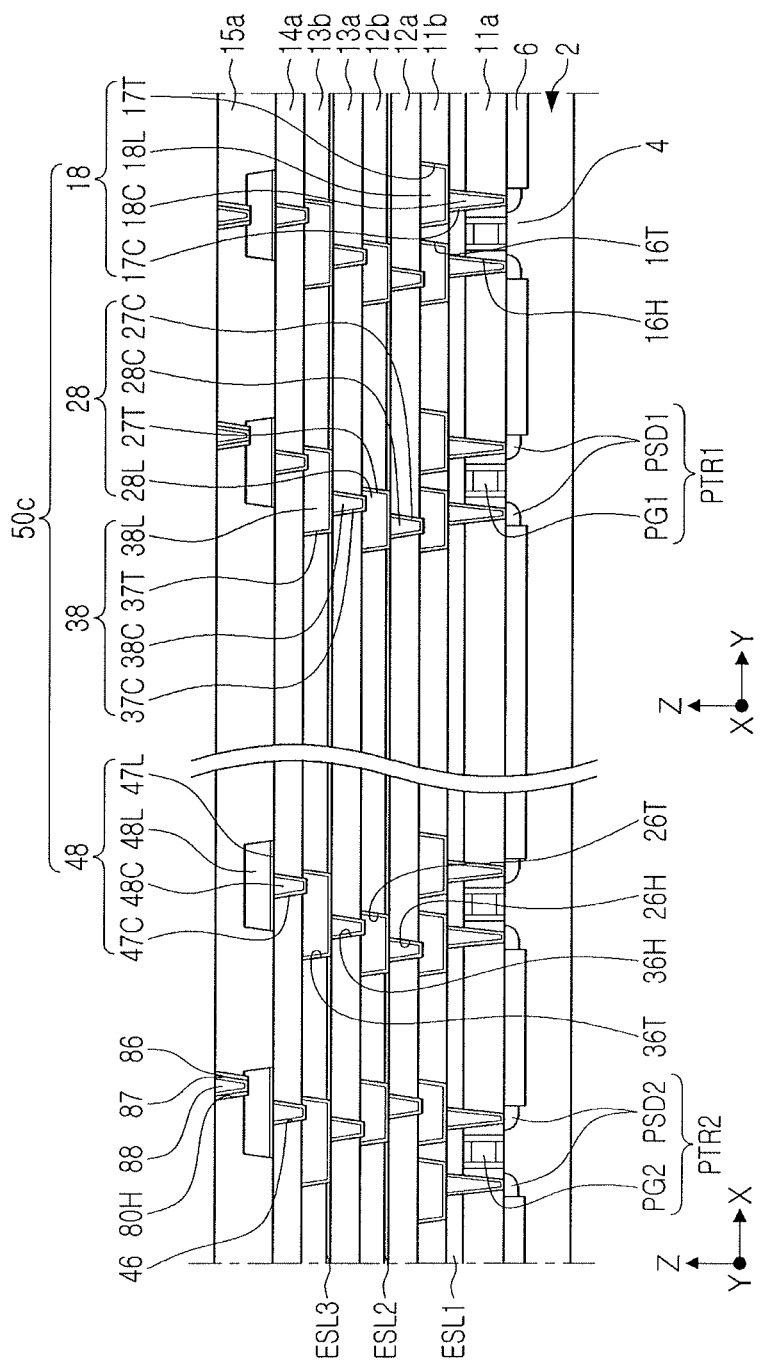

FIGS. 11 and 12 are cross-sectional views of stages in a method of manufacturing a semiconductor device including the components of FIG. 4.

Referring to FIG. 11, an element isolation region 6 may be formed on a semiconductor substrate 2 to define an active region 4 by using the manufacturing method as illustrated in FIG. 5. First and second peripheral transistors PTR1 and PTR2 may be formed on the semiconductor substrate 2.

A first via interlayer insulating layer 11a and a first lower capping layer ESL1 may be formed to be sequentially stacked on the semiconductor substrate 2 having the first and second peripheral transistors PTRI and PTR2. The first via interlayer insulating layer 11a may be formed of a silicon oxide insulating material.

A first lower contact hole 16H passing through the first via interlayer insulating layer 11a and the first lower capping layer ESL1 may be formed using a single damascene process. Subsequently, a first contact via barrier layer 17C may be formed on bottom and sidewall surfaces of the first lower contact hole 16H, and a first lower contact via 18C may be formed in the first contact via barrier layer 17C.

A first wiring interlayer insulating layer 11b may be formed on the first lower capping layer ESL1 and the first lower contact via 18C, and a first lower wiring trench 16T on the first lower contact via 18C and passing through the first wiring interlayer insulating layer 11b may be formed. A first lower wiring barrier layer 17T and a first lower wiring 18L may be formed in the first lower wiring trench 16T.

An upper surface of the first wiring interlayer insulating layer 11b and an upper surface of the first lower wiring 18L may be at a same level or surface by a planarization process. The planarization process may be a chemical mechanical polishing process.

Referring back to FIG. 6, a second via interlayer insulating layer 12a may be formed on the first wiring interlayer insulating layer 11b. A second lower contact hole 26H passing through the second via interlayer insulating layer 12a may be formed using a damascene process.

A second contact via barrier layer 27C and a second lower contact via 28C may be sequentially formed in the second lower contact hole 26H.

A second lower capping layer ESL2 and a second wiring interlayer insulating layer 12b may be sequentially formed on the second via interlayer insulating layer 12a and the second lower contact via 28C.

A second lower wiring trench 26T on the second lower contact via 28C and passing through the second interlayer insulating layer 12b and the second lower capping layer ESL2 may be formed. A second lower wiring barrier layer 27T and a second lower wiring 28L may be sequentially formed in the second lower wiring trench 26T.

A third via interlayer insulating layer 13a may be formed on the second wiring interlayer insulating layer 12b. A third lower contact hole 36H passing through the third via interlayer insulating layer 13a may be formed using a damascene process.

A third contact via barrier layer 37C and a third lower contact via 38C may be sequentially formed in the third lower contact hole 36H.

A third lower capping layer ESL3 and a third wiring interlayer insulating layer 13b may be sequentially formed on the third via interlayer insulating layer 13a and the third lower contact via 38C.

A third lower wiring trench 36T on the third lower contact via 38C and passing through the third wiring interlayer insulating layer 13b and the third lower capping layer ESL3 may be formed. A third lower wiring barrier layer 37T and a third lower wiring 38L may be sequentially formed in the third lower wiring trench 36T.

A fourth via interlayer insulating layer 14a may be formed on the third wiring interlayer insulating layer 13b. An upper contact hole 46H passing through the fourth via interlayer insulating layer 14a may be formed using a damascene process.

An upper contact via barrier layer 47C and an upper contact via 48C may be sequentially formed in the upper contact hole 46H.

An upper wiring barrier material layer 47M and an upper wiring material layer 48M may be formed on the fourth via interlayer insulating layer 14a and the upper contact via 48C.

The upper wiring barrier material layer 47M may be formed of a metal nitride such as TiN.

The upper wiring material layer 48M may be formed of the same material as or a different material from the lower wirings 18L, 28L, and 38L, and, e.g., may be formed of a refractory metal formed by a CVD process, e.g., CVD tungsten, or may be formed of a refractory metal formed by a PVD process, e.g., PVD tungsten.

As described in the description of FIG. 2, formation conditions of a second material layer included in the upper wiring material layer 48M may be controlled such that a size of a grain of the second material layer is smaller than a size of a grain of a first material layer included in the lower wirings 18L, 28L, and 38L. In an implementation, sizes of the grains of the first material layer and the second material layer may be differently formed by adjusting a type of source gas and a temperature of a chamber in the CVD process. A size of a second seam included in the second material layer may be smaller than a size of a first seam included in the first material layer.

Referring to FIG. 12, the upper wiring material layer 48M and the upper wiring barrier material layer 47M may be patterned to form an upper wiring barrier layer 47L and an upper wiring 48L, sequentially stacked. The grain size of the second material layer constituting the upper wiring 48L may be reduced, such that infiltration of the spacer layer 86 into the upper wiring 48L may be minimized.

A fifth interlayer insulating layer 15a may be formed on the upper wiring barrier layer 47L and the upper wiring 48L.

A contact plug hole 80H passing through the fifth interlayer insulating layer 15a to expose the upper wiring 48L may be formed.

A spacer layer 86 may be formed on a sidewall of the contact plug hole 80H. Forming the spacer layer 86 may include forming an insulating material layer covering sidewalls and bottom surfaces of the contact plug hole 80H, and anisotropically etching the insulating material layer. The spacer layer 86 may be formed of silicon oxide.

A stud barrier layer 87 may be formed on a bottom surface and the sidewall of the contact plug hole 80H having the spacer layer 86 formed therein, and a contact stud 88 filling the contact plug hole 80H may be formed.

In an implementation, the contact plug hole 8014 may extend into the upper wiring 48L. In an implementation, the contact plug hole 8011 may be formed by removing at least a portion of an upper region of the upper wiring 48L.

In an implementation, a component such as a memory cell structure and the like may be formed by the manufacturing method described with reference to FIG. 1.

One or more embodiments may provide a semiconductor device having a wiring structure.

One or more embodiments may provide a semiconductor device with improved productivity and reliability.

According to embodiments, the properties of the wiring structure may be adjusted to provide a semiconductor device with improved productivity and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a semiconductor substrate;
    a memory cell structure on the semiconductor substrate; and
    a peripheral wiring structure between the semiconductor substrate and the memory cell structure to connect the semiconductor substrate and the memory cell structure,
    wherein:
    the peripheral wiring structure includes at least one lower wiring structure and an upper wiring structure on the at least one lower wiring structure,
    the at least one lower wiring structure includes a lower wiring,
    the upper wiring structure includes an upper wiring,
    the lower wiring includes a first material layer having first grains,
    the upper wiring includes a second material layer having second grains, and
    an average size of the second grains is smaller than an average size of the first grains.

2. The semiconductor device as claimed in claim 1, further comprising:
    a first conductive line electrically connected to the memory cell structure; and
    a first contact plug between the first conductive line and the upper wiring,
    wherein:
    the first contact plug is in contact with the upper wiring, and
    the first contact plug includes a contact stud, a stud barrier layer surrounding side and lower surfaces of the contact stud, and an insulating spacer layer surrounding a side surface of the stud barrier layer.

3. The semiconductor device as claimed in claim 2, wherein a lower surface of the first contact plug is at a lower level than an upper surface of the upper wiring.

4. The semiconductor device as claimed in claim 2, wherein at least a portion of the insulating spacer layer extends into the upper wiring.

5. The semiconductor device as claimed in claim 1, wherein:
the first material layer includes a first seam,
the second material layer includes a second seam,
a size of the second seam is smaller than a size of the first seam.

6. The semiconductor device as claimed in claim 1, wherein:
the at least one lower wiring structure further includes a lower contact via below the lower wiring, and
the upper wiring structure further includes an upper contact via below the upper wiring and connected to the lower wiring.

7. The semiconductor device as claimed in claim 6, wherein:
the lower wiring includes a lower wiring barrier layer covering lower and side surfaces of the first material layer, and
the upper wiring includes an upper wiring barrier layer covering lower and side surfaces of the second material layer.

8. The semiconductor device as claimed in claim 7, wherein:
the first material layer is spaced apart from the lower contact via by the lower wiring barrier layer therebetween, and
the second material layer is spaced apart from the upper contact via by the upper wiring barrier layer therebetween.

9. The semiconductor device as claimed in claim 6, wherein the upper contact via is in contact with the lower wiring and extends into the lower wiring.

10. The semiconductor device as claimed in claim 1, wherein:
the at least one lower wiring structure further includes:
a lower contact via extending in a direction from a lower portion of the lower wiring toward the semiconductor substrate, and
a lower barrier layer covering lower and side surfaces of the lower wiring and extending to side and lower surfaces of the lower contact via, and
the upper wiring structure further includes:
an upper contact via extending in a direction from a lower portion of the upper wiring toward the semiconductor substrate, and
an upper barrier layer covering lower and side surfaces of the upper wiring and extending to side and lower surfaces of the upper contact via.

11. The semiconductor device as claimed in claim 1, wherein:
the at least one lower wiring structure further includes a lower wiring barrier layer covering lower and side surfaces of the lower wiring,
the upper wiring structure further includes an upper wiring barrier layer covering a lower surface of the upper wiring,
the upper wiring barrier layer does not cover a side surface of the upper wiring.

12. The semiconductor device as claimed in claim 11, wherein:
the side surface of the lower wiring is tapered such that a width of the lower wiring increases along a direction moving away from the semiconductor substrate, and
the side surface of the upper wiring is tapered such that a width of the upper wiring decreases along the direction moving away from the semiconductor substrate.

13. A semiconductor device, comprising:
a semiconductor substrate;
a memory cell structure on the semiconductor substrate; and
a peripheral wiring structure between the semiconductor substrate and the memory cell structure,
wherein:
the peripheral wiring structure includes a lower wiring structure and an upper wiring structure on the lower wiring structure,
the lower wiring structure includes a lower wiring including a first material layer having a first seam,
the upper wiring structure includes an upper wiring including a second material layer having a second seam, and
an average size of the second seam is smaller than an average size of the first seam.

14. The semiconductor device as claimed in claim 13, wherein:
the lower wiring structure includes a plurality of lower wirings at different levels from the semiconductor substrate,
at least a portion of the plurality of lower wirings are connected to each other by a lower contact via between the plurality of lower wirings.

15. The semiconductor device as claimed in claim 14, wherein:
the upper wiring structure includes an upper contact via between the upper wiring and the lower wiring structure,
the upper contact via is electrically connected to a lower wiring located at a highest level from the semiconductor substrate, among the plurality of lower wirings at different levels from the semiconductor substrate.

16. The semiconductor device as claimed in claim 13, further comprising:
a conductive line electrically connected to the memory cell structure; and
a contact plug between the conductive line and the upper wiring,
wherein:
the contact plug is in contact with the upper wiring, and
the contact plug includes a contact stud, a stud barrier layer surrounding side and lower surfaces of the contact stud, and an insulating spacer layer surrounding a side surface of the stud barrier layer.

17. The semiconductor device as claimed in claim 16, wherein at least a portion of the insulating spacer layer extends into the upper wiring.

18. A semiconductor device, comprising:
a semiconductor substrate;
a first conductive line on the semiconductor substrate and extending in a first direction, the first direction being parallel to an upper surface of the semiconductor substrate;
a second conductive line on the first conductive line and extending in a second direction, intersecting the first direction, the second direction being parallel to an upper surface of the semiconductor substrate;
a first memory cell structure between the first conductive line and the second conductive line;
a first upper wiring and a second upper wiring between the semiconductor substrate and the first conductive line, the first upper wiring and the second upper wiring being located at a same level from the semiconductor substrate;

a first contact structure on the first upper wiring and connecting the first conductive line to the first upper wiring;

a second contact structure on the second upper wiring and connecting the second conductive line to the second upper wiring;

at least one first lower wiring between the semiconductor substrate and the first upper wiring;

at least one second lower wiring between the semiconductor substrate and the second upper wiring;

a first upper contact via connecting the first upper wiring and the at least one first lower wiring;

a second upper contact via connecting the second upper wiring and the at least one second lower wiring;

a first lower contact via below the at least one first lower wiring; and a second lower contact via below the at least one second lower wiring, wherein:

the at least one first lower wiring and the at least one second lower wiring each include a first material layer having first grains, the first upper wiring and the second upper wiring each include a second material layer having second grains, and an average size of the second grains is smaller than an average size of the first grains.

19. The semiconductor device as claimed in claim 18, further comprising:

a third conductive line on the second conductive line and extending in the first direction;

a second memory cell structure between the second conductive line and the third conductive line;

a third upper wiring between the semiconductor substrate and the first conductive line, the third upper wiring being located at a same level from the semiconductor substrate as the first upper wiring and the second upper wiring; and a third contact structure on the third upper wiring and connecting the third conductive line to the third upper wiring, wherein:

the first contact structure includes a first lower word line contact plug and a second lower word line contact plug on the first lower word line contact plug, the second contact structure includes a first bit line contact plug, a second bit line contact plug on the first bit line contact plug, and a third bit line contact plug on the second bit line contact plug, the third contact structure includes a first upper word line contact plug, a second upper word line contact plug on the first upper word line contact plug, a third upper word line contact plug on the second upper word line contact plug, and a fourth upper word line contact plug on the third upper word line contact plug, the first lower word line contact plug, the first bit line contact plug, and the first upper word line contact plug are located at a same level, and the second lower word line contact plug, the second bit line contact plug, and the second upper word line contact plug are located at a same level.

20. The semiconductor device as claimed in claim 18, wherein the first memory cell structure includes a switching material pattern and an information storage material pattern.

* * * * *